United States Patent [19]
Ito et al.

[11] Patent Number: 6,166,845
[45] Date of Patent: Dec. 26, 2000

[54] ELECTRO-OPTIC PROBE

[75] Inventors: Akishige Ito; Katsushi Ohta; Toshiyuki Yagi; Mitsuru Shinagawa; Tadao Nagatsuma; Junzo Yamada, all of Tokyo, Japan

[73] Assignees: Ando Electric Co., Ltd.; Nippon Telegraph and Telephone Corporation, both of Tokyo, Japan

[21] Appl. No.: 09/317,917

[22] Filed: May 25, 1999

[30] Foreign Application Priority Data

May 28, 1998 [JP] Japan .................................. 10-148033

[51] Int. Cl.$^7$ ...................................................... G02F 1/03
[52] U.S. Cl. ............................................ 359/245; 359/251
[58] Field of Search .................................. 359/245, 240, 359/252, 251; 385/3, 24

[56] References Cited

U.S. PATENT DOCUMENTS 5,724,459   3/1998   Banba et al. ............................. 359/245

FOREIGN PATENT DOCUMENTS

| 5-40158 | 2/1993 | Japan . |
|---|---|---|
| 5-47883 | 2/1993 | Japan . |
| 5-72299 | 3/1993 | Japan . |
| 5-80083 | 3/1993 | Japan . |
| 5-240895 | 9/1993 | Japan . |
| 6-94807 | 4/1994 | Japan . |
| 7-55497 | 3/1995 | Japan . |
| 7-55891 | 3/1995 | Japan . |
| 8-43499 | 2/1996 | Japan . |
| 8-152361 | 6/1996 | Japan . |
| 8-160110 | 6/1996 | Japan . |
| 8-262117 | 10/1996 | Japan . |
| 9-159733 | 6/1997 | Japan . |
| 9-197019 | 7/1997 | Japan . |
| 9-211035 | 8/1997 | Japan . |

OTHER PUBLICATIONS

M. Shinagawa, et al., "A High–Impedance Probe Based on Electro–Optic Sampling," Proceedings of 15th Meeting on Lightwave Sensing Technology, LST May, 15–17, 1995.

*Primary Examiner*—Hung Xuan Dang
*Attorney, Agent, or Firm*—Burns Doane Swecker & Mathis L.L.P.

[57] ABSTRACT

The present invention relates to a probe for an electro-optic sampling oscillator.

The probe for an electro-optic sampling oscillator provides a laser diode that generates a laser beam based on the control signal of the electro-optical sampling oscilloscope; a collimator lens that makes the laser beam into a parallel beam; an electro-optic element that has a reflecting film at the end; an isolator provided between the collimator lens and the electro-optic element that passes the laser beam that is generated by the laser diode and separates the reflected beam of the laser beam that was reflected by the reflecting film; photodiodes that convert the reflected beam separated by the isolator into an electrical signal; and a condenser lens provided between the isolator and the electro-optic element that condenses the parallel beam to one point on the reflecting film, makes the reflected beam reflected by the reflecting film into a parallel beam again, and makes the optical axes of the light incident on the reflecting film and the light reflected by the reflecting film coincide.

3 Claims, 4 Drawing Sheets

ELECTRO-OPTIC PROBE

BACKGROUND OF THE INVENTION

1. Field of the Invention

The present invention is a probe for an electro-optical sampling oscilloscope that couples an electrical field generated by a measured signal and an electro-optic crystal, inputs into this electro-optic crystal a pulse generated based on a timing signal from a timing generation circuit, and observes the waveform of the measured light by the state of the polarization of the input light pulse, and relates in particular to an electro-optic sampling oscilloscope probe having an improved optical system.

This application is based on Japanese Patent Application, No. Hei 10-148033 filed in Japan, the content of which is incorporated herein by reference.

2. Description of the Related Art

It is possible to couple an electrical field generated by a measured signal with an electro-optic crystal, input a laser beam into this electro-optic crystal, and observe the waveform of the measured signal by the state of the polarization of the laser beam. It is possible pulse the laser beam, and observe with an extremely high time resolution when sampling the measured signal. The electro-optic sampling oscilloscope uses an electro-optic probe exploiting this phenomenon.

When this electro-optic sampling oscilloscope (hereinbelow, referred to as an "EOS oscilloscope") is compared to a conventional sampling oscilloscope using an electrical probe, the following characteristics have received much attention:
1. It is ease to observe the signal because a ground wire is unnecessary.
2. Because the metal pins at the end of the electro-optic probe are not connected to the circuit system, it is possible to realize high input impedance, and as a result of this, there is almost no degradation of the state of the measured point.
3. By using an optical pulse, broadband measurement up to the GHz order is possible.

The structure of a probe for an EOS oscilloscope in the conventional technology will be explained using FIG. 4. In FIG. 4, reference numeral 1 is a probe head made from an insulating body, and a metal pin 1a is inserted into its center. Reference numeral 2 is an electro-optic element, in which the reflecting film 2a is provided on the side facing the end surface of the metal pin 1a so as to abut the metal pin 1a. Reference numeral 4 is a half-wave plate, and reference numeral 5 is a quarter-wave plate. Reference numerals 6 and 9 are polarization beam splitters. Reference numeral 7 is a half-wave plate, and reference numeral 8 is a Faraday rotator. Reference numeral 10 is a collimator lens, and reference numeral 11 is a laser diode. Reference numerals 12 and 14 are condenser lenses. Reference numerals 13 and 15 are photodiodes.

In addition, the two polarization beam splitters 6 and 9, the half-wave plate 7, and the Faraday rotator 8 comprise an isolator 16 that transmits the light emitted from the laser diode 11, in order to split the light reflected by the reflecting film 2a.

Next, referring to FIG. 4, the path of the laser beam emitted form the laser diode 11 is explained. In FIG. 4, reference letter 'A' denotes the path of the laser beam.

First, the laser beam emitted from the laser diode 11 is converted by the collimator lens 10 into a parallel beam that travels straight through the polarization beam splitter 9, the Faraday rotator 8, the half-wave plate 7, and the polarization beam splitters 6, and then transits the quarter-wave plate 5 and the half-wave plate 4, and is incident on the electro-optic element 2. The incident light is reflected by the reflecting film 2a formed on the end surface of the electro-optic element 2 on the side facing the metallic pin 1a.

The reflected laser beam transits the half-wave plate 4 and the quarter-wave plate 5, one part of the laser beam is reflected by the polarized light beam splitter 6, condensed by the condenser lens 12, and incident on the photodiode 13. The laser beam that has transited the polarized light beam splitter 6, is reflected by the polarization beam splitter 9, condensed by the condenser lens 14, and incident on the photodiode 15.

Moreover, the half-wave plate 4 and the quarter-wave plate 5 adjust the strength of the laser beam incident on the photodiode 13 and the photodiode 15 so as to be uniform.

Next, using the EOS oscilloscope probe shown in FIG. 4, the procedure for measuring the measured signal is explained.

When the metallic pin 1a is placed in contact with the measurement point, due to the voltage applied to the metallic pin 1a, at the electro-optic element 2 this electrical field is propagated to the electro-optic element 2, and the phenomenon of the altering of the refractive index due to the Pockels effect occurs. Thereby, the laser beam emitted form the laser diode 11 is incident on the electro-optic element 2, and when the laser beam is propagated along the electro-optic element 2, the polarization state of the beam changes. Additionally, the laser beam having this changed polarization state is reflected by the reflecting film 2a, is condensed and incident of the photodiode 13 and the photodiode 15, and converted into an electrical signal.

Along with the change in the voltage at the measurement point, the change in the state of polarization by the electro-optic element 2 becomes the output difference between the photodiode 13 and the photodiode 15, and by detecting this output difference, it is possible to observe the electrical signal applied to the metallic pin 1a.

In this connection, in an EOS oscilloscope, because an effect wherein the electric field propagated in the metallic pin 1a causes a change in the polarization state of the beam propagating through the electro-optic element 2, when attempting to convert efficiently the change in electrical field due to the measuring signal to the change in the polarized beam, it is preferable that the beam propagating in the electrooptic element 2 be narrower than the diameter of the metallic pin 1a.

In addition, the electro-optic element 2 is a structure that reflects in incident laser beam by a reflecting film 2a, but in order to make the incidence of the reflected beam on the two photodiodes 13 and 15 efficient, it is necessary to make the incident and reflected axes of the parallel beam coincide. When the optical axes of the incident and the reflected beam do not coincide, as shown in FIG. 4, the laser beam follows the light path shown by this broken lines (reference letter B in FIG. 4), and the laser beam is not incident on the photodiodes 13 and 15. Thus, the reflecting film 2a must be disposed orthogonally to the optical axis of the parallel beam.

However, in order to dispose orthogonally the incident and reflecting axes of the parallel beam and the reflecting film 2a, there is the problem that a high precision aligning technology and a large amount of alignment time are necessary.

In addition, when replacing the probe head 1 that anchors the electro-optic element 2, it is difficult to anchor the reflecting film 2a on the end surface of the electro-optic element 2 of the probe head 1 in the same position as that prior to replacement, and thus there is the problem that an alignment operation for realigning the optical axes is necessary.

In addition, the plane of polarization of the polarized light beam splitter 6 and the polarized light beam splitter 9, which split the reflected light, must coincide so that the photodiode 13 and the photodiode 15 can be disposed on the same plane. Due to this, in order to cause the polarized light surface that is rotated 45° by the electro-optic element 2 to the original orientation, the half-wave plate 7 is provided, and thus number of structural components becomes large, the alignment points become numerous, and the unnecessary internal reflected light increases.

SUMMARY OF THE INVENTION

Thus, an object of the present invention is to provide a probe for an electro-optic sampling oscilloscope that can efficiently make the laser beam generated by the laser diode incident on the photodiode and the photodiode, and furthermore, simplifies the structure by decreasing the number structural components, and can decrease the alignment operations.

The present invention attains this object by a probe for an electro-optic oscilloscope provided with a laser diode that generates a laser beam based on the control signal of the electro-optical sampling oscilloscope; a collimator lens that makes this laser beam into a parallel laser beam; an electro-optic element that has a reflecting film at the end; an isolator provided between the collimator lens and the electro-optical element that passes the laser beam generated by the laser diode and separates the reflected beam of the laser beam that was reflected by the reflecting film; photodiodes that convert the reflected light separated by the isolator into an electrical signal; and a collimator lens provided between the isolator and the electro-optic element that condenses the parallel beam to one point on the reflecting film, makes the reflected beam reflected by the reflecting film a parallel beam again, and makes the optical axes of the beam incident on the reflecting film and the beam reflected by the reflecting film coincide.

In addition, the present invention provides the advantage of simplifying the assembly operations because it is possible to relax the tolerance of the installation angle of the electro-optic element that forms the reflecting film on the end surface.

In addition, the present invention provides the advantage that when replacing the probe head that includes the electro-optic element, even when there is variation in the installation angle in the assembly of the probe head, it is possible to obtain a stable functioning, and furthermore, alignment of the optical axes after replacing the probe head is unnecessary.

In addition, according to the present invention, the object is attained by a probe for an electro-optic oscilloscope provided with a laser diode that generates a laser beams based on the control signal of the electro-optical sampling oscilloscope; a collimator lens that makes the laser beam into a parallel beam; a electro-optic element that has a reflecting film at the end; a isolator provided between the collimator lens and the electro-optical element that passes the laser beam that is generated by the laser diode and separates the reflected beam of the laser beam that was reflected by the reflecting film; photodiodes that convert the reflected beam separated by the isolator into an electrical signal; and wherein the isolator comprises first and second polarized light beam splitters that pass the laser beam emitted from the laser diode and split the laser beam reflected by the reflecting film, and a Faraday rotator that rotates the plane of polarization of the laser beam 45°, and further wherein the second polarized light beam splitter is disposed rotated 45° centered on the optical axis of the laser beam with respect to the first polarized light beam splitter.

In addition, the present invention provides the advantages that it is possible to decrease the cost, decrease the alignment points, and decrease the unnecessary reflected light because it is possible to decrease the optical parts that form the probe.

DESCRIPTION OF THE PREFERRED EMBODIMENTS

Figure 1:
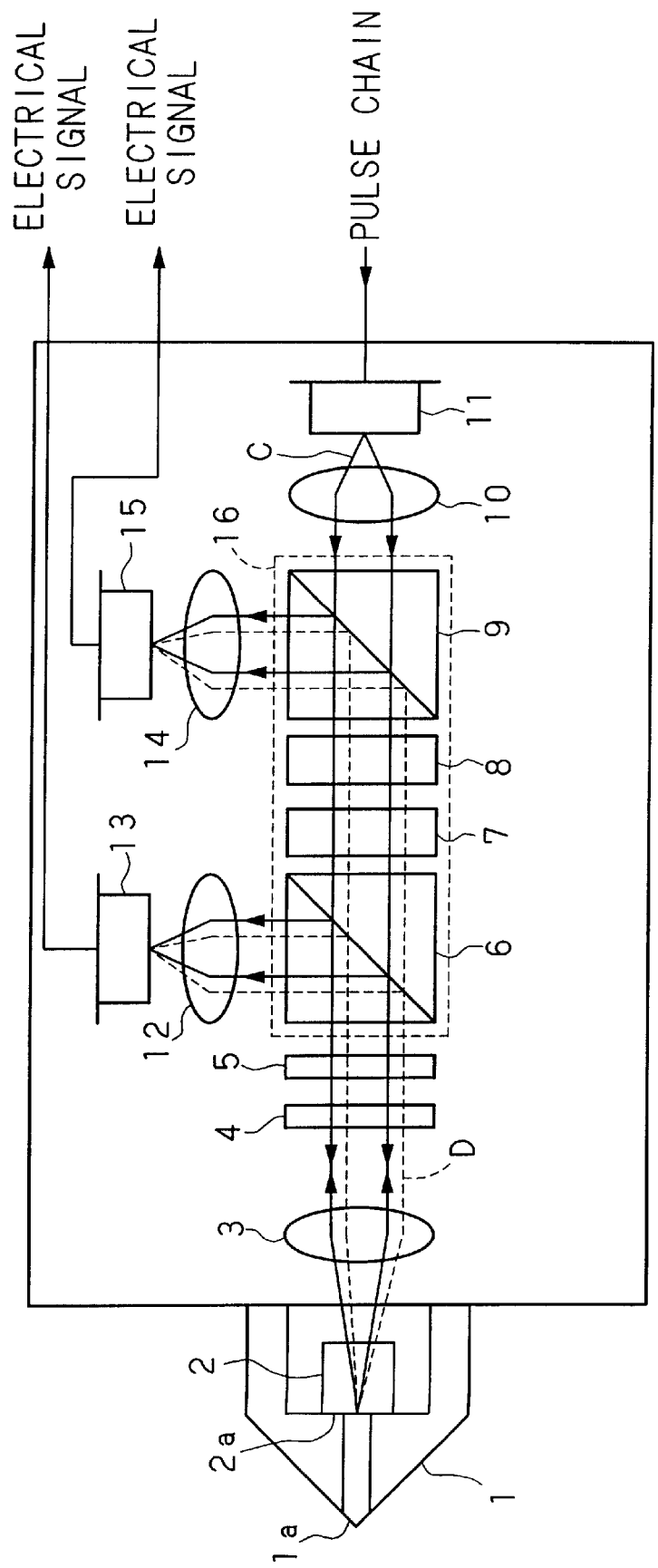
FIG. 1 is a structural diagram showing the structure of the first embodiment of the present invention.

The following embodiment does not limit the invention according to the claims. In addition, in order to attain the object, the combination of all the features explained in the embodiments are not necessarily necessary.

Below, the probe for an electro-optic sampling oscilloscope according to the first embodiment of the present invention will be explained referring to the drawings.

Figure 4:
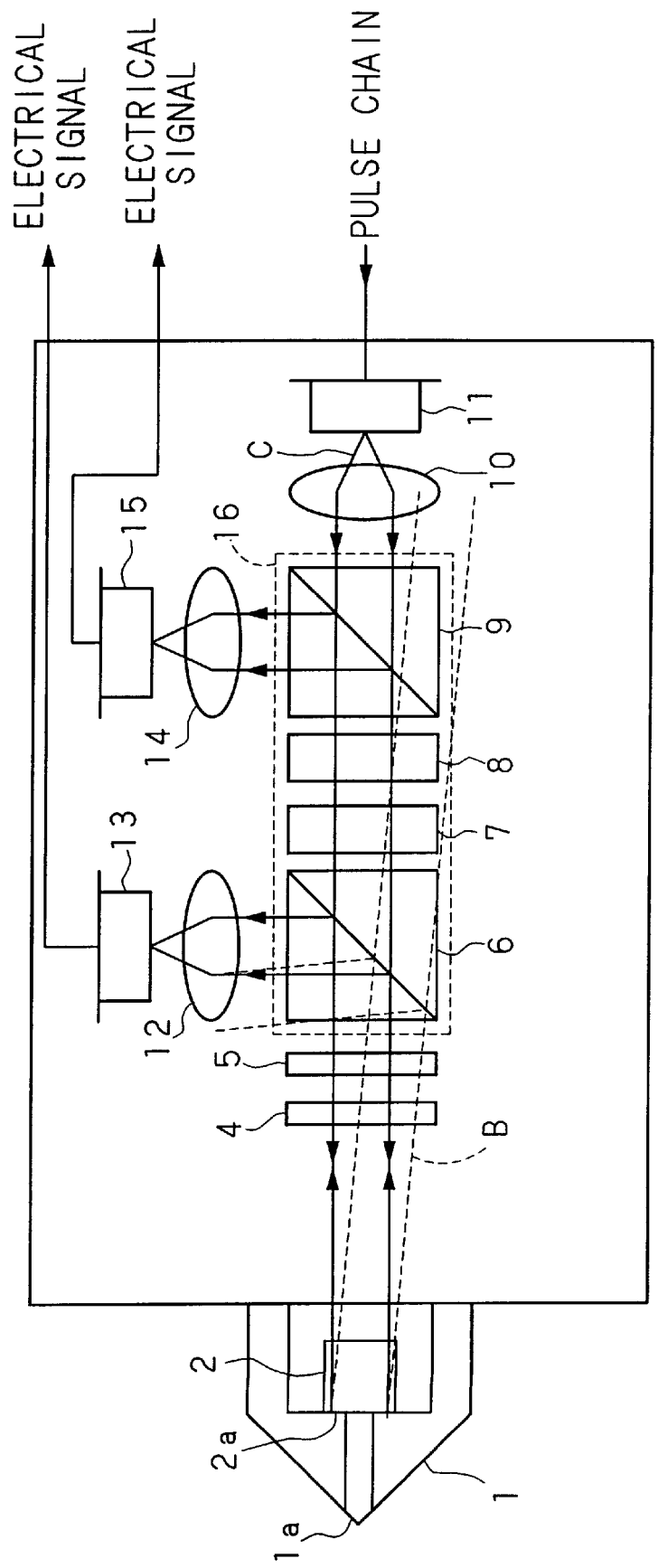
FIG. 4 is a structural diagram showing the structure of the probe for an EOS oscilloscope according to conventional technology.

FIG. 1 is a drawing showing the structure of the first embodiment. In FIG. 1 parts identical to those in FIG. 4 are denoted with the same reference numerals, and their explanation is omitted. The probe shown in this figure differs from the conventional technology in that there is a collimator lens 3 provided between the electro-optic element 2 and the half-wave plate. The condenser lens 3 is disposed separated from the reflecting film 2a provided on the end surface of the electro-optic element 2 by only the focal distance of the condenser lens 3.

Next, referring to FIG. 1, the optical path of the laser beam emitted from the laser diode 11 will be explained. In FIG. 1, the optical path of the laser beam is denoted by reference letter C.

First, the laser beam emitted from the laser diode 11 is converted to a parallel beam by the collimator lens 10, this passes through the polarization beam splitter 9, the Faraday rotator 8, the half-wave plate 7, and the polarized light beam splitter 6, and further, passes through the quarter-wave plate 5 and the half-wave plate 4.

Next, the parallel beams that transits the half-wave plate 4 is condensed by the condenser lens 3, is incident on the electro-optic element 2, and reflected by the reflecting film 2a formed on the end surface of the electro-optic element 2 on the side facing the metallic pin 1a.

Because the condenser lens 3 is disposed at a position separated from the reflecting film 2a only by the focal distance of the condenser lens 3, the laser beam converted into a parallel beam by the collimator lens 10 is condensed to one point on the reflecting film 2a.

On the reflecting film 2a, the reflected laser beam is converted again into a parallel beam by the condenser lens 3, and furthermore, this passes through the half-wave plate 4 and the quarter-wave plate 5, is split by the polarized light beam splitters 6 and 9, incident on the photodiodes 15 and 16, and converted into electrical signals.

In this manner, by converging the incident parallel beams to one point on the reflecting film 2a using the condenser lens 3, even when the reflecting film 2a is not orthogonal with respect to the incident parallel beam, the light reflected by the reflecting film 2a is transformed into a parallel beam again by the condenser lens 3 (reference numeral D in FIG. 1). Thus, it is possible for the optical axes of the reflected and the incident parallel beam to be made parallel. The amount of separation of the optical axes of this parallel beam is a small amount of the parallel movement with respect to the amount of misalignment with the angle of the reflecting film 2a, and thus, it is possible to align the axes efficiently and simply by the condenser lens 12 and the condenser lens 14.

In addition, when the probe head is replaced, even if the reflecting film 2a is not orthogonal with respect to the optical axis, the reflected light does not miss the condenser lens 12 and the condenser lens 14, and it is possible to condense all the light generated by the laser diode 11 on the photodiode 13 to the photodiode 15.

Moreover, by determining the diameter of the condenser lens 3 of the optical system based on the tolerance of the installation angle of the reflecting film 2a, even if the installation angle is misaligned by only the maximum allowable value of the installation angle of the reflecting film 2a, the light can be condensed on the photodiodes 13 and 15.

In addition, the size of the effective surface for the structural parts other than the condenser lens 3 that form the optical system can be decided by making them correspond to the diameter of the condenser lens 3.

Figure 3:
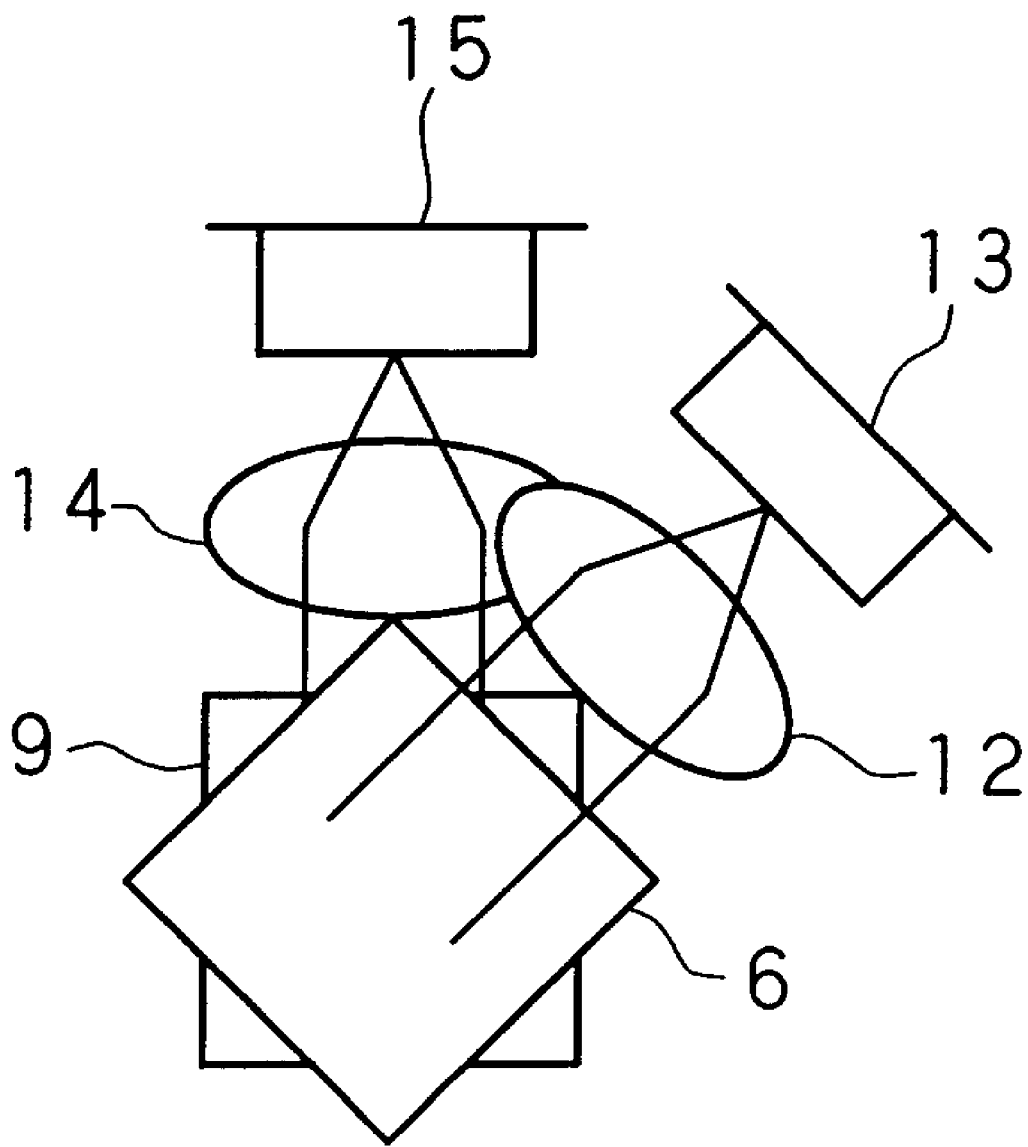
FIG. 3 is a side view showing the disposition of the optical system of the embodiment shown in FIG. 2.

In addition, the collimator lens 10 and the condensing lenses 3, 12, and 14 shown in FIGS. 1 and 3 are shown to be single concave lenses, but a plurality of concave and convex lenses can be combined to correct aberration. In addition, a reflecting mirror can also be used in the optical system.

Next, another embodiment will be explained referring to FIGS. 2 and 3.

Figure 2:
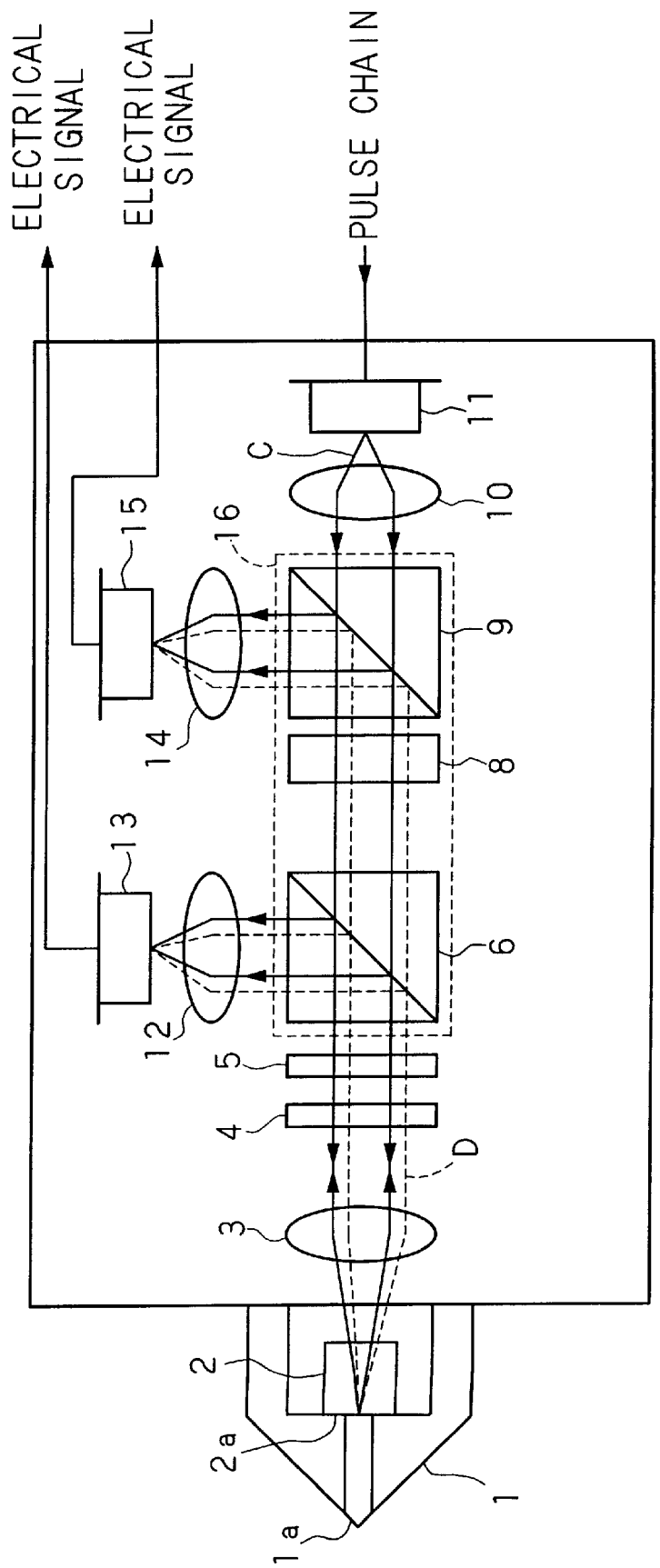
FIG. 2 is a structural diagram showing the structure of another embodiment of the present invention.

FIG. 2 is a drawing showing the structure of another embodiment. In FIG. 2, the parts that are identical to those in FIG. 1 have the same reference numbers, and their explanation is omitted. The probe shown in this figure differs from the one shown in FIG. 1 in that the half-wave plate 7 is eliminated from the isolator 16, and it is structured from polarized light beam splitters 6 and 9, and a Faraday rotator 8. However, the polarized light beam splitter 6 is rotated 45° centered on the optical axis of the parallel beams transformed by the collimator lens 10.

FIG. 3 is a side view showing from the side of the probe head 1 the polarization beam splitters 6 and 9, the condenser lenses 12 and 14, and the photodiodes 13 and 15. As shown in this figure, by rotating the plane of polarization of the polarized light beam splitter 6 by 45°, the parallel beam emitted form the collimator lens 10 passes through the polarization beam splitter 9, and the plane of polarization is rotated 45° by the Faraday rotator 8, but because the plane of polarization of the polarized light beam splitter 6 is disposed rotated 45°, even if the half-wave plate 7 is eliminated, the beam will pass though. Subsequently, as described above, the beam is reflected by the reflecting film 2a, split by the polarized light beam splitters 6 and 9, condensed by the condensing lenses 12 and 14, and is incident on the photodiodes 13 and 15.

In this manner, even if the half-wave plate 7 is eliminated, by rotating the polarized light beam splitter 6, the condenser lens 12, and the photodiode 13 by 45° centered on the optical axes, an operation of the same degree as when the half-wave plate 7 is provided can be obtained, and furthermore, the number of structural components can be decreased, and the number of points aligned during the assembly operation can be decreased.

What is claimed is:

1. A probe for an electro-optic sampling oscilloscope comprising:

a laser diode that generates a laser beam based on the control signal of the electro-optical sampling oscilloscope;

a collimator lens that makes the laser beam into a parallel beam;

an electro-optic element that has a reflecting film at the end;

an isolator provided between the collimator lens and the electro-optical element that passes the laser beam that is generated by the laser diode and separates the reflected beam of the laser beam that was reflected by the reflecting film;

photodiodes that convert the reflected light separated by the isolator into an electrical signal; and a condenser lens provided between the isolator and the electro-optic element, condenses the parallel beam to one point on the reflecting film, makes the reflected light reflected by the reflecting film a parallel beam again, and makes the optical axes of the light incident on the reflecting film and the light reflected by the reflecting film coincide.

2. A probe for an electro-optic sampling oscilloscope comprising:

a laser diode that generates a laser beam based on the control signal of the electro-optical sampling oscilloscope;

a collimator lens that makes the laser beam into a parallel beam;

an electro-optic element that has a reflecting film at the end;

an isolator provided between the collimator lens and the electro-optical element that passes the laser beam that is generated by the laser diode and separates the reflected beam of the laser beam that was reflected by the reflecting film;

photodiodes that convert the reflected light separated by the isolator into an electrical signal; and wherein said isolator comprises:

first and second polarization beam splitters that pass the laser beam emitted from the laser diode and split the laser beam reflected by the reflecting film; and a Faraday rotator that rotates the plane of polarization of the laser beam 45°; and further wherein:

the second polarization beam splitter is disposed rotated 45° centered on the optical axis of the laser beam with respect to the first polarization beam splitter.

3. A probe for an electro-optic sampling oscilloscope comprising:

a laser diode that generates a laser beam based on the control signal of the electro-optical sampling oscilloscope;

a collimator lens that makes the laser beams into a parallel beam;

an electro-optic element that has a reflecting film at the end;

an isolator provided between the collimator lens and the electro-optic element that passes the laser beam that is generated by the laser diode and separates the reflected beam of the laser beam that was reflected by the reflecting film;

photodiodes that convert the reflected light separated by the isolator into an electrical signal;

a condenser lens provided between the isolator and the electro-optic element that condenses the parallel beam to one point on the reflecting film, makes the reflected beam reflected by the reflecting film into a parallel beam again, and makes the optical axes of the beam incident on the reflecting film and the beam reflected by the reflecting film coincide; and wherein said isolator comprises:
   first and second polarization beam splitters that pass the laser beam emitted from the laser diode and split the laser beam reflected by the reflecting film; and
   a Faraday rotator that rotates the plane of polarization of the laser beam 45°; and wherein
      the second polarization beam splitter is disposed rotated 45° centered on the optical axis of the laser beam with respect to the first polarization beam splitter.

* * * * *